United States Patent [19]

Reylek

[11] Patent Number: 5,890,915
[45] Date of Patent: Apr. 6, 1999

[54] ELECTRICAL AND THERMAL CONDUCTING STRUCTURE WITH RESILIENT CONDUCTING PATHS

[75] Inventor: Robert S. Reylek, Minneapolis, Minn.

[73] Assignee: Minnesota Mining and Manufacturing Company, Saint Paul, Minn.

[21] Appl. No.: 651,185

[22] Filed: May 17, 1996

[51] Int. Cl.[6] .................................................. H01R 4/58
[52] U.S. Cl. ............................................. 439/91; 439/66
[58] Field of Search ................................. 439/66, 91, 86, 439/65

[56] References Cited

U.S. PATENT DOCUMENTS

| | | | |
|---|---|---|---|
| 3,541,222 | 11/1970 | Parks et al. | 174/68.5 |
| 3,542,939 | 11/1970 | Mintz | 174/35 |
| 3,609,104 | 9/1971 | Ehrreich | 252/511 |
| 3,680,037 | 7/1972 | Nellis et al. | 339/61 M |
| 3,743,890 | 7/1973 | Neu | 317/101 CP |

(List continued on next page.)

FOREIGN PATENT DOCUMENTS

| | | |
|---|---|---|
| 0 633 579 A2 | 1/1995 | European Pat. Off. . |
| 1 587 416 | 4/1981 | United Kingdom . |
| 1 588 527 | 4/1981 | United Kingdom . |
| 2 276 502 | 9/1994 | United Kingdom . |
| WO 95/18476 | 7/1995 | WIPO . |

OTHER PUBLICATIONS

Fulton, J., et al., "An Overview of Elastomeric Conductive Polymer Interconnection Materials and Their Use in MCM Technology," Proceedings of the Electronic Components and Technology Conference (ECTC), San Diego, CA, Institute of Electrical and Electronics Engineers, pp. 473–480 (18 May 1992).

Primary Examiner—Neil Abrams
Assistant Examiner—Katrina Davis
Attorney, Agent, or Firm—H. Sanders Gwin

[57] ABSTRACT

A conducting structure includes a dielectric matrix with a first surface and a second surface. At least one via extends from the first surface of the matrix to the second surface of the matrix. In the at least one via conductive members are formed which include conductive elements and an optional binder. The conductive elements have a maximum dimension of: (i) at least about 5% of a length of the via, and, (ii) at least about 10% of the width of the via. The size, shape and number of conductive elements in each via, as well as the composition of the binder, may be selected to provide a conductive element with a controlled electrical and/or thermal conductivity, and a controlled modulus, for a particular application.

31 Claims, 8 Drawing Sheets

U.S. PATENT DOCUMENTS

| | | | |
|---|---|---|---|
| 3,795,037 | 3/1974 | Luttmer | 29/628 |
| 3,795,884 | 3/1974 | Kotaka | 339/17 LM |
| 3,852,878 | 12/1974 | Munro | 29/629 |
| 3,862,790 | 1/1975 | Davies et al. | 339/17 LM |
| 3,870,385 | 3/1975 | Avakian et al. | 339/48 |
| 3,954,317 | 5/1976 | Gilissen et al. | 339/17 E |
| 3,982,320 | 9/1976 | Buchoff et al. | 29/630 R |
| 4,008,300 | 2/1977 | Ponn | 264/104 |
| 4,008,519 | 2/1977 | Gilissen et al. | 29/625 |
| 4,050,756 | 9/1977 | Moore | 339/59 M |
| 4,057,311 | 11/1977 | Evans | 339/17 M |
| 4,064,623 | 12/1977 | Moore | 29/629 |
| 4,240,198 | 12/1980 | Alonso | 29/876 |
| 4,330,165 | 5/1982 | Sado | 339/59 M |
| 4,548,862 | 10/1985 | Hartman | 428/323 |
| 4,640,981 | 2/1987 | Derg et al. | 174/117 FF |
| 4,693,530 | 9/1987 | Stillie et al. | 439/66 |
| 4,740,657 | 4/1988 | Tsukagoshi et al. | 174/88 |
| 4,770,641 | 9/1988 | Rowlette | 439/86 |
| 4,778,950 | 10/1988 | Lee et al. | 174/356 |
| 4,818,241 | 4/1989 | Smoot | 439/65 |
| 4,918,814 | 4/1990 | Redmond et al. | 29/878 |
| 4,993,482 | 2/1991 | Dolbear et al. | 165/80.2 |
| 4,998,885 | 3/1991 | Beaman | 439/66 |
| 5,037,312 | 8/1991 | Casciotti et al. | 439/66 |
| 5,041,183 | 8/1991 | Nakamura et al. | 156/264 |
| 5,045,249 | 9/1991 | Jin et al. | 264/24 |
| 5,049,085 | 9/1991 | Reylek et al. | 439/91 |
| 5,101,553 | 4/1992 | Carey | 29/882 |
| 5,122,064 | 6/1992 | Zarreii | 439/65 |
| 5,123,849 | 6/1992 | Deak et al. | 439/66 |
| 5,140,405 | 8/1992 | King et al. | 357/67 |
| 5,141,444 | 8/1992 | Redmond et al. | 439/59 |
| 5,152,868 | 10/1992 | Schiltz et al. | 156/643 |
| 5,174,766 | 12/1992 | Yoshizawa et al. | 439/91 |
| 5,187,020 | 2/1993 | Kwon et al. | 428/601 |
| 5,216,807 | 6/1993 | Yoshizawa et al. | 439/66 |
| 5,248,262 | 9/1993 | Busacco et al. | 439/66 |
| 5,265,329 | 11/1993 | Jones et al. | 29/832 |
| 5,275,856 | 1/1994 | Calhoun et al. | 428/40 |
| 5,340,318 | 8/1994 | Kunihiro | 439/66 |
| 5,350,308 | 9/1994 | Laska et al. | 439/91 |
| 5,371,654 | 12/1994 | Beaman et al. | 361/744 |
| 5,374,196 | 12/1994 | Horine | 439/65 |
| 5,413,510 | 5/1995 | Taylor | 439/886 |
| 5,588,846 | 12/1996 | Irlbeck et al. | 439/66 |

ELECTRICAL AND THERMAL CONDUCTING STRUCTURE WITH RESILIENT CONDUCTING PATHS

BACKGROUND OF THE INVENTION

1. Field of the Invention

The present invention principally relates to the electrical and/or thermal interconnection of electronic components, such as integrated circuit devices, which have a large array of closely spaced conductive contact sites. More particularly, the present invention is an anisotropically conductive matrix of a dielectric material with at least one electrically and/or thermally conductive element extending therethrough to provide electrical and/or thermal conduction in at least one direction through the matrix. Even more particularly, the present invention is an elastomeric matrix having at least one via containing a conductive member made up of electrically and/or thermally conductive elements, preferably in a polymeric binder. The conductive elements have a maximum dimension of: (i) about 5% to about 120% of the length of the vias through the matrix, and, (ii) about 10% to about 100% of the width of the via. The size and shape of the conductive elements, as well as the properties of the binder and the matrix material, may be selected to provide a conductive member in each via with specified electrical and/or thermal properties and rigidity to form a reliable interconnection between the contact sites on the electronic devices.

2. Description of Related Art

To alleviate many of the problems associated with C-4 or solder ball connection systems while achieving a high density of electrical connections, it is desirable to have a flexible connection between an electronic device and the package to which the device is electrically interconnected and mechanically mounted. Many examples are known in the art of anisotropically conductive interposers for electrical connection which consist of a resilient dielectric matrix material having a discrete configuration of conductive elements extending transversely therethrough. While the properties of the dielectric matrix material play a significant role in electrical interconnection, it is also understood that the properties of the conductive elements also have a significant effect on the quality of the connection provided by the resilient interposer.

For example, the conductive members in the connector must be sufficiently resilient to accommodate differences in height among contacts on the electronic devices to be interconnected, to prevent undue stress on the fragile contacts, and to provide a reusable structure for testing and burn-in applications. However, the conductive members in the resilient connection system must be sufficiently rigid to provide contact wipe to penetrate surface films, debris and oxide layers on the mating contacts on the devices to minimize contact resistance.

For example, U.S. Pat. No. 5,049,085 to Reylek describes an anisotropically conductive polymeric matrix including a polymeric layer or film, preferably adhesive in nature, with a plurality of conducting members therethrough. The conductive members, which are preferably tubular in design, are preferably made of metals deposited on the walls of the orifices in the polymeric layer at a thickness of about 100 Å to about 0.005 inch (0.013 cm). The '085 patent states that as the thickness of the conductive surfaces increases, the conductor wall becomes stiffer and less deformable, which decreases contact efficiency by failing to accommodate variations in height and shape of the mating contacts on the electronic devices to be interconnected.

To accommodate such height/shape variations in the mating contacts, it is well known in the art that the conductive members in the resilient matrix may comprise a conductive powder in a resilient binder. For example, U.S. Pat. No. 4,008,300 to Ponn describes a multi-conductor element for interconnecting circuit boards and the like. Conductive material consisting of a slurry of a conductive powder in a resilient liquid vehicle is filled into the gaps created in an elastomeric matrix, with the conductive material protruding above the surface of the elastomeric matrix. The pressure engaged connections provided by the resilient contacts in the connector described in the '300 patent protect delicate electronic devices from damage during connection procedures and accommodate variations in the shape and structure of mating contacts, but the combination of a conductive powder in an elastomeric vehicle does not provide a conductive member that is sufficiently rigid to provide the preferred wiping action on the surfaces on the mating contacts. A similar lack of wiping action might be expected from the connector described in U.S. Pat. No. 5,037,312 to Casciotti et al., in which the conductive members in the elastomeric matrix material consist of a resilient gel loaded with conductive particles.

U.S. Pat. No. 5,275,856 to Calhoun describes an electrically conductive adhesive tape with at least one flexible carrier web that has a low adhesion face bearing on an adhesive layer. The tape is formed with a plurality of perforations, each of which is filled with electrically conductive particles. The conductive particles may include metals, metal coated polymeric particles and graphite. The particles used in the examples of the '856 patent had a Fisher subsieve size of about 2.2 to about 7 $\mu$m, and the particles were placed in vias in the adhesive matrix having a maximum breadth of about 0.1 mm and a depth of at least 0.5 mm. The conductive adhesive tape was capable of carrying about 10 amps/cm$^2$ through its thickness.

In preferred applications, the perforations in the Calhoun '856 patent also contain not only the conductive particles, but an organic binder, which can bind the particles in each perforation into durable, column-like conductive members. The binder may be selected to influence the properties of the conductive member, e.g., to permit collapse of the columns when a connection is made, to provide resilience, or to add to the adhesive bond provided by the adhesive layer. When used, the binder typically contributes from about 1 to about 50% of the volume of the conductive member, although the volume fractions of conductive particulate may be adjusted to control electrical conductivity.

The '856 patent states that when the conductive particles in the vias are soft, moderate hand pressure applied to the mating contacts on the electronic devices to be interconnected can flatten the particles to provide a small, flat conductive area where each particle contacts another particle or an electrode. Thus, as with the other conventional connector systems with conductive particles discussed above, the conductive members in the '856 protect delicate electronic devices from damage during connection procedures and accommodate variations in the shape and structure of mating contacts. However, the combination of a conductive powder in an elastomeric vehicle distributes contact pressure uniformly, and is not sufficiently rigid to provide high local pressures at the contact surfaces to create a wiping action on the surfaces. In addition, the multiplicity of contact points among the small particles in the vias would be expected to create an excessively high resistance to current flow.

Thus, a need exists in the art for a conductive member having the resilience to provide reusability and to accommodate variations in the shape and structure of the mating contacts on electronic devices, but reserving some measure of rigidity to provide high local pressure and a wiping action at the surface of the mating contacts. The conductive member must also conduct significant amounts of current and/or thermal energy between mating contacts, and must have a low resistance to the flow of electrical and/or thermal energy.

SUMMARY OF THE INVENTION

The present invention is a conducting structure comprising a dielectric matrix with a first surface and a second surface, and at least one passageway, or via, connecting the first surface to the second surface. The via contains a conductive member comprising electrically and/or thermally conductive elements, preferably in a binder. The conductive elements have a maximum dimension of: (i) at least about 5%, preferably about 5% to about 120%, of the length of the vias through the matrix, and, (ii) at least about 10%, preferably about 10% to about 100%, of the width of the via. The elements may be totally contained within the via, or may extend out of the via and beyond the surface of the matrix. The dimensions of the elements and the properties of the binder are selected to provide a conductive member with a modulus of about 1 MPa to about 200 Mpa, preferably about 2 MPa to about 50 MPa. The connector of the invention may be used to connect a first conductive surface on a first electric or electronic device generally located on the first surface of the matrix to a second conductive surface on a second electric or electronic device generally located on the second surface of the matrix.

The present invention also includes a method for making the conducting structure, which may comprise forming a matrix material with at least one via, coating a slurry of electrically and/or thermally conductive elements, preferably in a binder, on a surface of the matrix such that the elements and/or elements and binder enter the via in the matrix material, and removing the excess slurry from the surface of the matrix material such that the elements and/or elements and binder remain in the via. The binder, if any, may then be cured by any appropriate method, with heat, at room temperature, with actinic radiation, and the like. The vias may be formed in the matrix material by any known method, including, for example, mechanical punching or laser drilling, or by casting the matrix material on a mold having an arrangement of discrete projections.

The conductive elements in the members formed in the matrix material are significantly larger than the particles used in conventional conductive members. The enhanced element size means that, on average, a relatively small number of conductive elements will reside in any one via compared to conventional systems. Assuming a given conductive element type and binder, the interparticle friction and interference between the larger elements provide a conductive member which, while retaining more flexibility than a solid member, is more rigid, e.g. has a greater modulus, than the members in conventional connectors which comprise a larger number of extremely fine particles.

The resilient properties of the conductive elements make the conducting structure of the invention reusable, and each element in the matrix can accommodate variations in the shape and structure of the mating contacts on electronic devices. However, the large elements or the cured binder/elements have limited lateral freedom and resist moving past one another in the via, and form a column-like rigid structure to enhance wiping action on the surfaces on the mating contacts. The reduced number of larger conductive elements in each via provides fewer points of element-to-element contact, which lowers the series resistance, increases contact pressure between the individual elements and the contacting sites, and increases the current-carrying capacity compared to conventional conductive members with large numbers of small elements. Since interfacial resistance is dependent on the applied force, the large particles also reduce pressure required to make a low resistance contact.

DETAILED DESCRIPTION OF THE PREFERRED EMBODIMENTS

Figure 1:
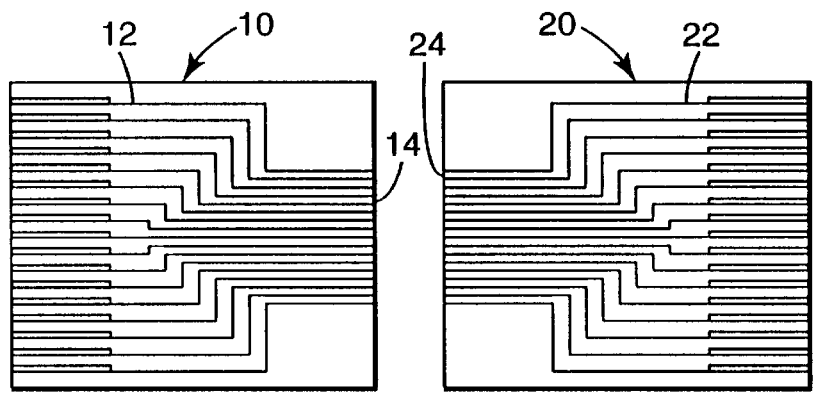
FIG. 1 is a schematic view of electronic devices that may be interconnected with the conducting structure of the invention.
Figure 2:
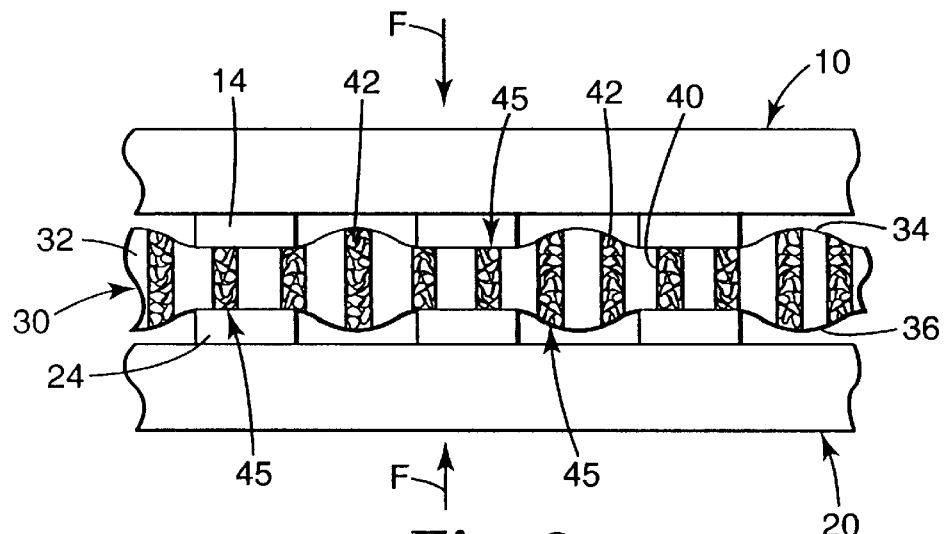
FIG. 2 is a cross-sectional view of the connector of the invention as used to interconnect a first electronic device to a second electronic device.
Figure 3:
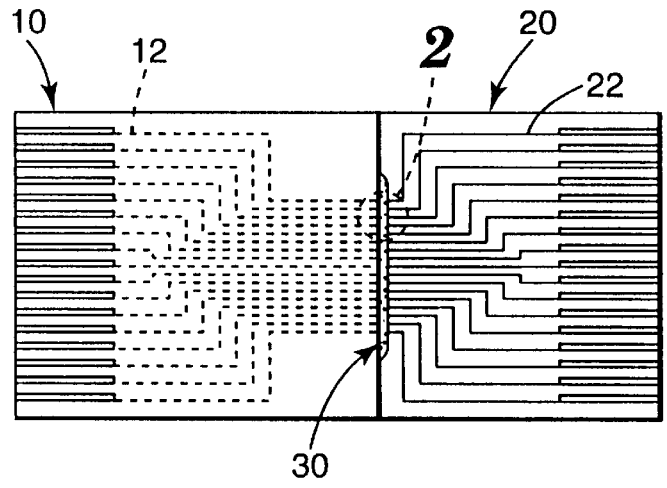
FIG. 3 is a perspective view of the conducting structure of the invention as used to interconnect a first electronic device to a second electronic device.

Typically the conducting structure of the invention is placed between a first electronic device with a first set of multiple contacts and a second electronic device with a second set of multiple contacts and pressure is applied to make an electrical and/or thermal interconnection. For example, FIG. 1 shows a first electronic circuit board 10 with an array of metallic circuit traces 12 on a surface thereof, and includes a first set of contacts 14. A second electronic circuit board 20 includes an array of metallic circuit traces 22 on a surface thereof, and includes a second set of contacts 24. As shown in FIGS. 2–3, the connector 30 of the invention may be used to electrically and/or thermally interconnect the first set of contacts 14 on the first circuit board 10 to the second set of contacts 24 on the second circuit board 20.

The electrical connector 30 of the invention may include a matrix 32 with a first surface 34 and a second surface 36. In this embodiment the matrix 32 includes at least one, preferably a plurality, of transverse vias 40 which extend from the first surface 34 of the matrix 32 to the second surface 36 thereof. The vias 40 contain conductive elements 42 and an optional binder (not shown). When a connecting force F is applied to press the first circuit board 10 against the second circuit board 20, the interposing conductive elements 42 interact with one another, with the material making up the matrix 32, and with the optional binders to form a column-like structure which functions as a conductive member 45 in the connector 30. The conductive members then provide an electrical and/or thermal interconnection between the contacts 14 and the contacts 24 on the electronic devices. The contacts on the electronic devices to be interconnected may have a wide variety of shapes. Any device having a contact with a shape or structure which may interact with the conductive members may be used as a connection point. For example, metal strips, wires, solder balls, and combinations thereof may extend into or attach to the conductive members to provide interconnection. As explained in more detail below, the rigidity and electrical and/or thermal characteristics of the conductive members 45 may be finely tuned for specific contact shapes and interconnect applications. For example, as noted in U.S. Pat. No. 5,049,085 to Reylek, the walls of the vias may be plated with a coating of metal to enhance conductivity.

The vias 40 typically will form an array or a repeating pattern in the matrix member 32, though not necessarily with equal spacings throughout. The spacing of the vias 40 in the array may also vary widely depending on the intended application, although the vias 40 should be no closer than a minimum distance apart to avoid short circuits among the conductive members in different vias when compressed in use. The vias 40 may be formed in the matrix 32 only in areas that correspond to the contacts 14, 24 to be interconnected. However, the conductive members in the vias 40 are typically provided in a regular array at a finer pitch than the mating contacts 14, 24 over the entire matrix 32, which eliminates the need to specifically orient the conductive array to the contacts on the electronic circuit boards or devices to be interconnected.

Figure 2A:
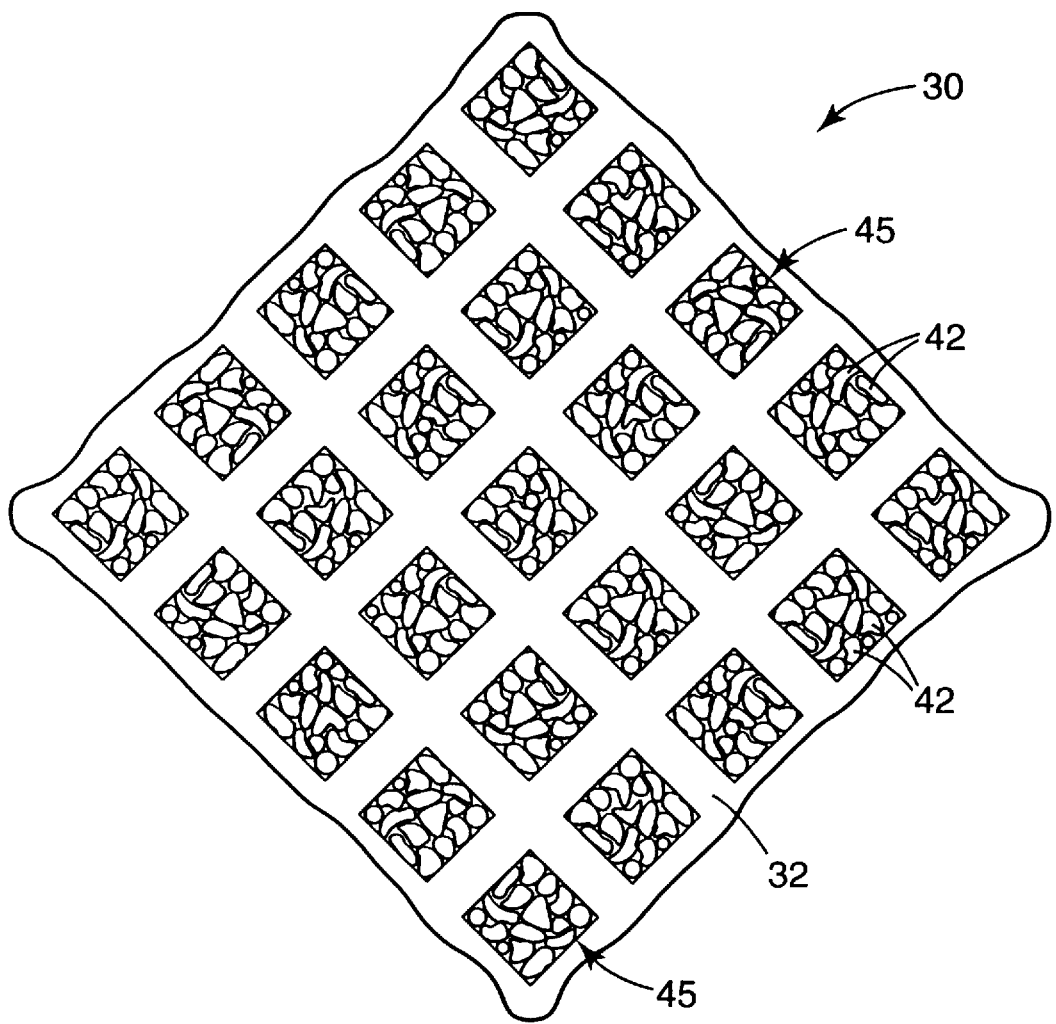
FIG. 2A is an overhead view, in perspective, of a conducting structure of the invention with vias having a generally square cross-section.

The vias 40 in the matrix 32 may have a variety of geometries according to the intended application. In addition to the substantially cylindrical shapes shown in cross-section in FIG. 2, the vias 40 may have regular or irregular shapes. For example, FIG. 2A shows another embodiment of a matrix 32 with a regular array of vias 40 with a square cross-section. In addition, cross-sectional shapes such as cones, pyramids, hemispheres, squares, cubes, polyhedrons, parallelepipeds, combinations thereof, and naturally occurring variations thereof, may be used. When the connector of the invention is used to interconnect closely spaced (e.g. about 0.6 mm to about 0.2 mm apart) electrodes as shown in FIG. 2, each via may typically have a diameter of less than about 0.2 mm, preferably less than about 0.05 mm, and the vias may have center-to-center spacing of less than about 0.2 mm without danger of short-circuits.

Figure 4:
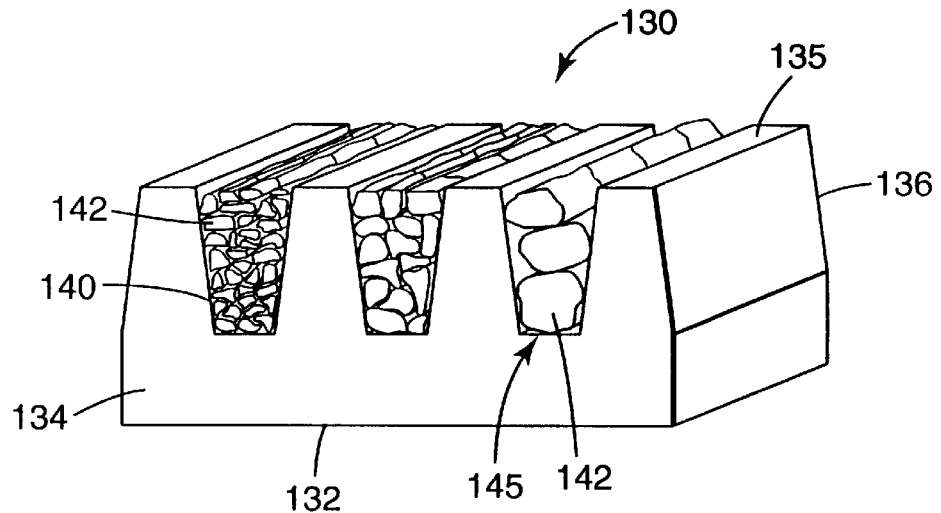
FIG. 4 is a perspective view of the conducting structure of the invention with large conductive troughs.

However, the spacing and geometry of the conductive members in the vias may vary widely depending on the intended application. For example, as shown in FIG. 4, to provide electrical interconnection between certain electronic devices (not shown), in the electrical connector 130 of the invention the vias 140 extending from the first surface 134 to the second surface 136 in the matrix 132 may be made trough-like. The conductive members 145 are then conductive channels which may be used to connect a contact on a first device adjacent the first surface 134 to a contact on a second device adjacent the second surface 136. In addition, the trough-like conductive member 145 has an exposed conductive area which may also be used to form electrical and/or thermal connections along a third surface 135, which is substantially normal to the plane of the first and second surfaces 134, 136 of the connector 130.

Figure 4A:
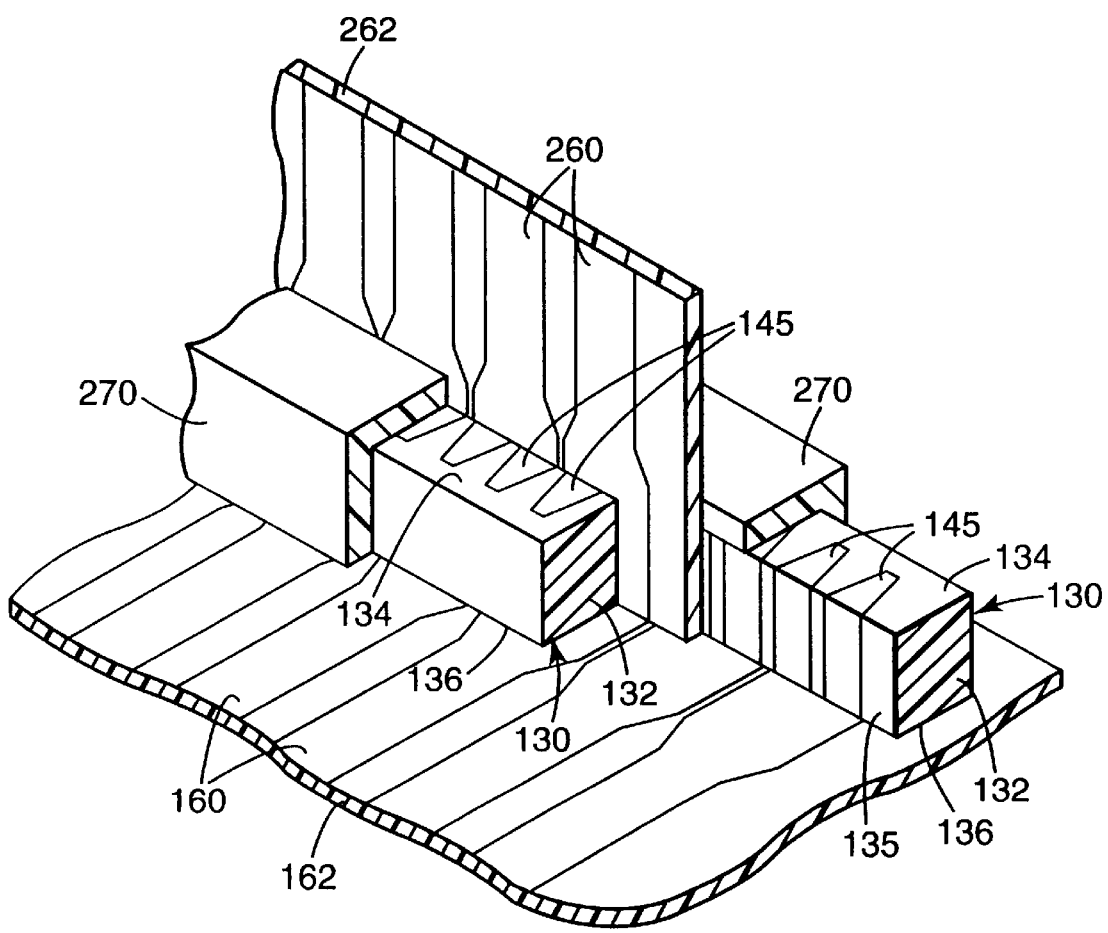
FIG. 4A is a perspective view of an embodiment of an electronic assembly of the invention.

For example, as shown in FIG. 4A, a first array of circuit traces 160 on a first circuit board 162 may be connected to a second array of circuit traces 260 on a second circuit board 262, with the first circuit board 162 generally normal to the second circuit board 262. The circuit traces 260 contact the exposed conductive area of the conductive member 145 along the third surface 135 of the matrix 132, while the circuit traces 160 contact the conductive member at the second surface 136 of the matrix 132. In such an arrangement a clamping member 270 applies a compressive force to pressure engage the matrix 132 and circuit boards 162, 262 in a first direction from the first surface 134 to the second surface 136, and in a second direction generally normal to a plane of the third surface 135. The pressure engagement biases the matrix 132 to provide secure electrical and/or thermal interconnection between the traces 160 and the traces 260.

The arrangement and shape of the conductive elements in the vias may vary widely depending on the intended application. For example, in the connector 30 of FIG. 2, the conductive elements 42 may be substantially spherical particles, flakes, or portions of wires with, for example, circular or rectangular cross sections, stacked atop and alongside one another in the vias 40. In the connector 130 of FIG. 4, the conductive elements 142 may be, for example, substantially larger pieces of wires arranged atop one another in the vias 140 (a variety of conductive element shapes are exemplified in FIG. 4). If necessary to provide electrical or thermal connection sites, wires, portions of wires, or thin metallic strips may extend above or below the plane of the matrix. Regardless which arrangement of conductive elements is selected for a particular application, the conductive elements in the vias should be arranged and spaced to contact one another in the members and provide a low-resistance, series and parallel electrical and/or thermal interconnection when the first electronic device and the second electronic device pressure engaged.

A protective cover coat may be provided on a surface of the matrix to protect the conductive elements from contamination or corrosion, and/or to provide additional mechanical support for the conductive members.

The material selected for the matrix must be a dielectric, and must have suitable properties to maintain the shape and rigidity of the conductive members in the vias so reliable electrical and/or thermal interconnection is maintained. Thermoplastics, thermoplastic elastomers, or thermosettable materials with sufficient structural integrity for handling during assembly have been found useful for the matrix material. In some applications, particularly when rigid metallic contacts must be inserted into the vias to make contact with the conductive members, the matrix may be made of a more rigid material, for example, a ceramic material or an injection molded plastic, to guide the contacts into position. If adhesion to the mating surface of the matrix is desired, the matrix material may be a hot tackifying, pressure sensitive, hot-melt or epoxy-matrixed adhesive as described in U.S. Pat. Nos. 5,049,085 and 5,275,856, which are incorporated herein by reference.

Preferably, the matrix material is an elastomer, such as, for example, a silicone, fluoroelastomer, urethane, acrylate, butyl rubber, or latex. A silicone elastomer is preferred, most preferably a polyvinyl siloxane. A particularly preferred siloxane material is the polyorganosiloxane described in copending and co-filed U.S. application Ser. No. 08/649,504 to Biernath et al., which is incorporated herein by reference. The binders are preferably curable at room temperature to preserve the dimensional integrity of the molded part, but may also be curable with heat.

Silicone elastomers may be easily cast on a tool or mold and removed to form the perforated matrix structure. In addition, the high temperature performance and low creep characteristics of silicone provide stability. Vinyl siloxanes are particularly preferred for use in the present invention to provide heat resistance, accurate reproduction of mold features, and good mold release characteristics for ease of fabrication.

The conductive elements which reside in each via in the matrix may comprise electrically or thermally conductive particles and combinations thereof. The conductive elements may include metals, such as, for example, copper, gold, silver, nickel, tungsten, tin, lead, palladium, bismuth, indium, gallium, and alloys thereof. The conductive elements may also include metallized polymers or metallized ceramics, such as alumina, silica, glass, polyimide, polystyrene, polyetherimide, and graphite. The conductive elements may also include non-metallic, thermally conductive materials such as, for example, alumina, beryllia, and boron nitride. The conductive elements may be provided in many forms, such as, for example, particles, wires, filaments, foil-wrapped textile strands, and metallized flakes. The elements may have a wide variety of regular and irregular shapes, such as, for example, spheres, rods, flakes, and filaments. Of the above, for electrical conduction metal particles are preferred, such as solid nickel or copper, silver coated nickel or copper, pure silver, nickel coated on graphite, gold on nickel, and mixtures thereof. The particles used in the present invention have a Knoop hardness of about 20 to about 7000, preferably about 50 to about 3000.

The conductive elements used in the present invention also preferably have a rough exterior surface with a large number of asperities, or sharp, small-radius surface features. The asperities and sharp features are believed to provide a "wiping action" which cuts through oxides and debris on the contacting sites of an electronic device to enhance the quality of the electrical connection between the contact and the conductive particle in the via.

The conductive elements used in the present invention have an average maximum dimension of at least about 5%, preferably about 10% to about 120%, and most preferably about 25% to about 50%, of the length of the vias through the matrix from the first surface thereof to the second surface thereof, i.e. along the direction of current flow between the interconnected electronic devices. The elements also have an average maximum dimension of at least about 20% of the width of the vias, preferably about 20% to about 100%, and most preferably about 50% of the width thereof. For the purposes of the present invention, element size distribution may be measured and calculated by any suitable means known in the art, such as, for example, with an image analyzer available from Olympus under the tradename Cue-2, by air classification, or by sieving.

It is preferred that a small number of conductive elements, or even a single element, reside in each via. The elements may reside within the via, or may protrude outside the via and extend above the surface of the matrix. As noted above, a small number of relatively large elements per via provides a conductive member which acts as a "column" having greater rigidity than conductive members composed of large numbers of fine particles. The clusters of large conductive elements build high surface pressures because of inter-element friction and interference, as well as adhesion to the binder, if used. As the size of the conductive elements approaches the dimensions of the vias, the limited lateral freedom means the elements resist moving past one another under compression, and high local contact pressures are created to break through contact contamination and provide a reliable contact with the contacting site on the electronic device.

However, while the small number of conductive elements has many of the characteristics of a solid conductive member, the multi-element conductive member of the invention is compliant enough the adjust to differing heights of mating contact sites on the electronic devices to be interconnected. The bulk of the compliance of the conductive members in the present invention results from the interaction between and relative motion among the conductive elements, not bending or element compression as in conventional materials with solid conductive members.

The small number of conductive elements also provides a conductive member which has the electrical characteristics more like that of a solid conductive member, such as low resistance and increased current carrying capacity, compared to conductive members composed of large numbers of fine particles. Because the conductive members in each via can be made as conductive as the filler will allow, without the possibility of shorting, good electrical conductivity can be achieved with the present invention. In contrast, conventional conductive elastomers rely on magnetic or other orientation processes to provide anisotropy. These processes usually utilize low particle densities to avoid the potential for short circuits and therefore are limited in their electrical conduction capability.

The conductive member which resides in the via preferably comprises the conductive particles described above and a binder. When used, the binder typically contributes about 1% to about 50% of the volume of the via. Useful binders may include polymeric materials, for example, rubber resins such as styrene-butadiene and ABS copolymers, thermosetting resins such as epoxy resins and cyanate esters, thermoplastic resins such as phenoxys, polysulfones, polyethersulfones, and polyvinyl acetal resins, fluorosilicones and fluoroelastomers. Binders may also include mixtures of thermosetting and thermoplastic resins such as described in U.S. Pat. No. 4,769,399. Binder materials selected for used in the present invention preferably have elastomeric properties, and a polyvinyl siloxane is preferred.

The properties of the cured binder, as well as the number, size and shape of the conductive elements, may be selected to provide a conductive member with a modulus suited to a particular application. For example, the conductive member is typically made more resistant to deformation than the matrix to concentrate the pressure on the conductive member and thereby improve the contact force. As noted above, the matrix may then also be made more rigid than the conductive members and guide contacts on the electronic devices into the vias. An example is a device with ball grid arrays or other protruding contacts which need to be accurately located over individual conductive members. In such as case the protruding contacts act as the contact pressure concentrators. The connector of the invention thus may be designed to have mechanical compliance in the conductive members, matrix, or both. The slight compression of the conductive members under pressure enhances electrical conductivity through the thickness of the structure.

Figure 8:
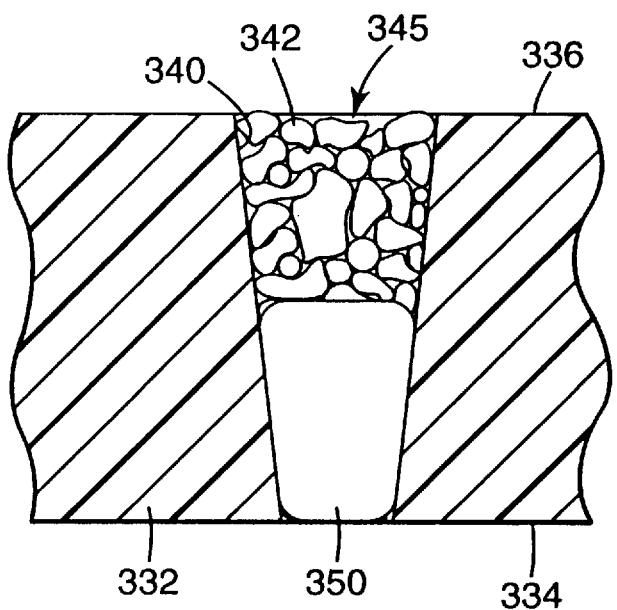
FIG. 8 is a schematic cross-sectional view of a conductive member of the present invention.

The modulus of the conductive member in a via may also be adjusted by adding a solid element, such as, for example, by partially filling the via with a low melting temperature metal, and filling the remainder of the via with conductive elements in a binder (See Example 3 below and FIG. 8). The low melting temperature metal is preferably a solder, such as a silver solder, a lead solder or an amalgam.

The conductive members in the present invention should have a modulus of about 1 MPa to about 200 MPa, preferably about 2 MPa to about 50 Mpa, and most preferably about 3 MPa to about 30 MPa, to ensure that the conductive elements in each member remain in firm contact with the contacting site on the electronic device, and cut through oxide formations and debris on the contact surface to enhance the quality of the electrical connection. The moduli of the matrix and conductive members in the present invention may be measured by any suitable means known in the art, such as with a spring tester available from Larson, Inc. under the tradename Model Super DHT.

In electronic applications where two components are pressure engaged, the connector of the present invention is particularly useful as a temporary or permanent interposer between them. For example, the present invention may be used for test and burn in of electronic devices, as well as for permanent electrical connections between devices and printed circuit boards. If the pitch of the arrays of conductive members are sufficiently fine, direct connections may be made between bare integrated circuit chips and their substrates.

To connect a first contact site on a first electronic device to a second contact site on a second electronic device using the electrical connector of the invention, the first electronic device is placed on a first surface of the matrix of the connector, and the second electronic device is placed on a second surface of the matrix of the connector, i.e. the connector is placed between the first contact site and the second contact site (see FIG. 2). The first contact site is placed in contact with at least one via, or a group of vias, which contain conductive members. The second contact site is placed in contact with at least one corresponding via or group of vias. Then pressure is applied by any conventional means, such as, for example, by displacement of a rigid housing with a press, or by spring loading, to bias or compress the matrix of the connector and the conductive members and provide secure electrical interconnection between the first contact site and the second contact site.

The applied pressure will vary widely depending on the intended application and type of electronic device, the size and shape of the vias, and the size and shape of the conductive members, but normally a pressure of greater than about 25 psi (0.17 MPa) is required to provide an electrical interconnection with a sufficiently low resistance (e.g. less than about 1 ohm($\Omega$)) for most applications. However, the applied pressure may be in the range of about 5 psi (0.034 MPa) to about 1000 psi (6.9 MPa), preferably about 50 psi (0.34 MPa) to about 200 psi (1.38 Mpa).

Figure 9:
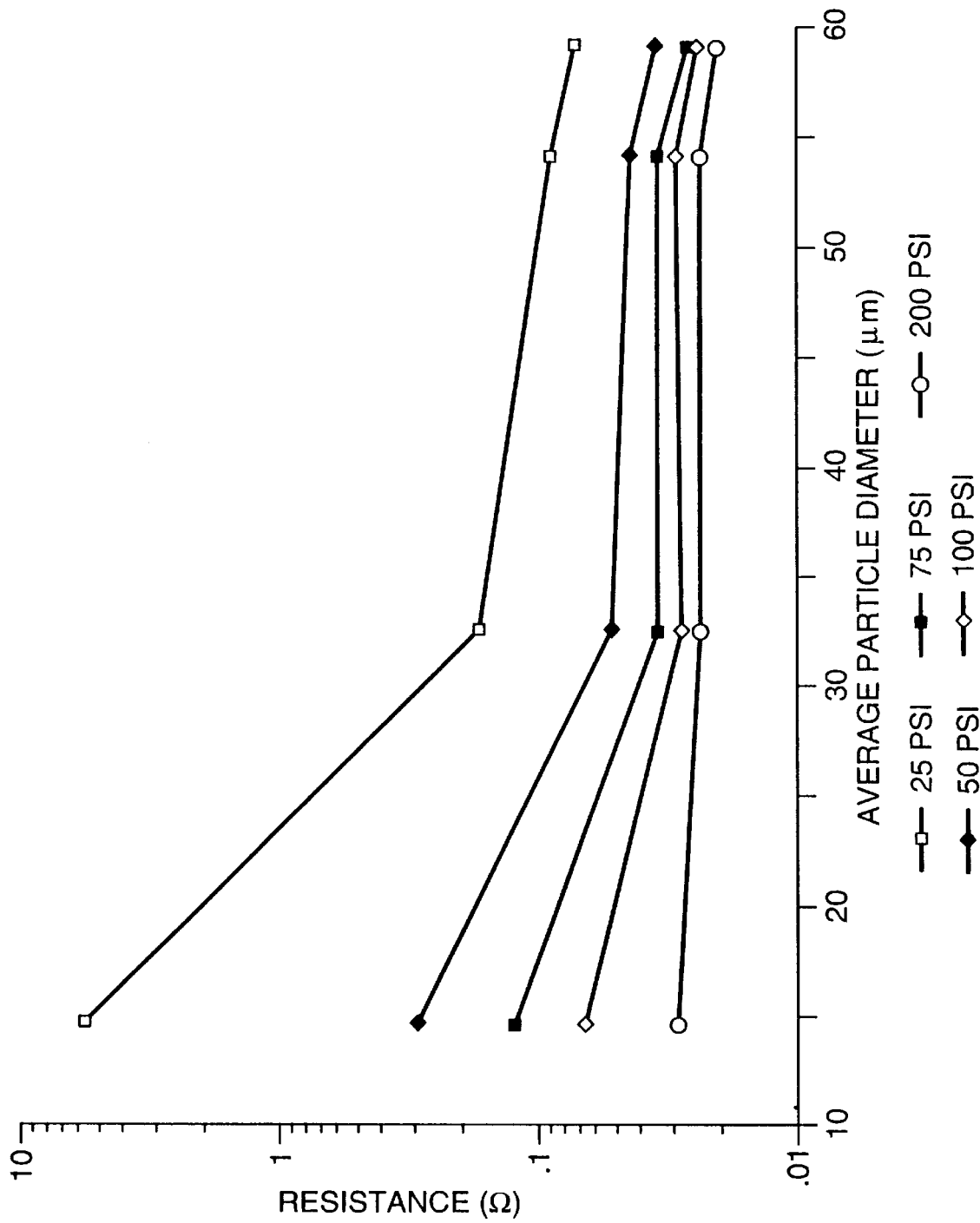
FIG. 9 is a plot of contact resistance versus average particle diameter for a conducting structure of the invention.
Figure 10:
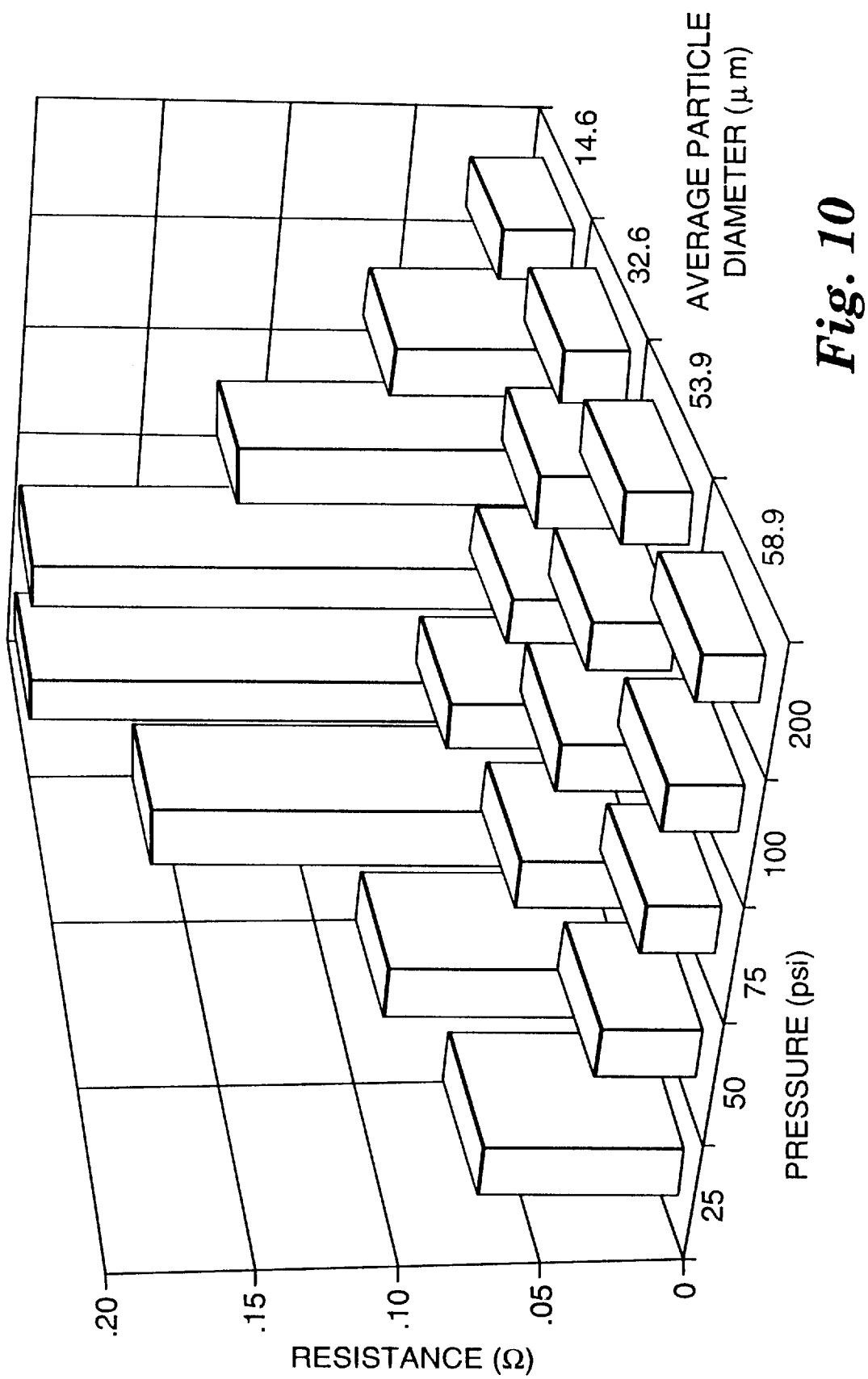
FIG. 10 is a plot of contact resistance versus average particle diameter for a conducting structure of the invention.

As shown in FIGS. 9–10, the larger conductive elements of the invention, with an average maximum element dimension of greater than about 15 $\mu$m, preferably about 50 $\mu$m to about 300 $\mu$m, placed in vias with a length of about 0.025 inch (0.064 cm) and width about 0.005 inch (0.013 cm) provide resistances of less than about 0.1 $\Omega$ for applied pressures of about 25 psi (0.17 MPa) to about 200 psi(1.38 MPa).

The connector of the invention may be made in a variety of ways. A preferred method for forming the matrix is to first form a pattern in a rigid plastic sheet material, such as an acrylic, with a device such as diamond turning machine. Such machines have extremely fine tolerances such that a variety of pattern arrays can be produced at an extremely fine pitch. The acrylic sheet may then be used to make a metal pattern, or a metal plate may be diamond turned to provide a tool with the requisite pattern of high aspect ratio protrusions necessary to create a matrix having vias with the desired geometries. Pyramid patterns and resulting holes and vias with aspect ratios of two or more can be achieved with diamond machining at very close tolerances. The thickness of the film formed on the tool is controlled by the height of the protrusions. The tool can also be made by laser drilling holes and casting polymer or metal into the holes forming protrusions on the tool.

The matrix is then formed by casting or otherwise applying an appropriate polymeric dielectric material to the protrusions in the pattern array on the metal plate. The protrusions on the metal plate typically are tapered, such that the polymer flows around protrusions to create holes at the protrusion locations. The result of this forming process is a screen-like structure with open holes or vias from one major face to the other.

Following the casting step, the cured polymeric matrix is removed from the metal plate. The vias are filled or coated with conductive elements to provide conductive members through the structure. These conductive members may be formed in vias in a variety of ways. Typically, a slurry-like blend of conductive elements and a binder is forced into the vias with a knife coater. Following removal of the excess slurry from the first and second surfaces of the matrix, the binder is cured, if necessary, to form conductive members in each via. Curing may be any appropriate means, such as thermally, by exposure to moisture, or exposure to radiation.

Another method of making the matrix material is to first coat and cure the polymeric dielectric material onto a release liner(s). Laser perforation or mechanical punching is then performed through the liner(s) and the matrix to form the vias. The slurry containing the conductive elements is then applied along with heat and pressure required to force the particles into the vias. A third method is to form the conductive members in an appropriate array, on a release liner and then overcoated the array with the matrix material to form the final connector.

The present invention will be further described with reference to the following examples, which are merely illustrative and not meant to limit the scope of the invention.

EXAMPLES

Example 1

Figure 5A:
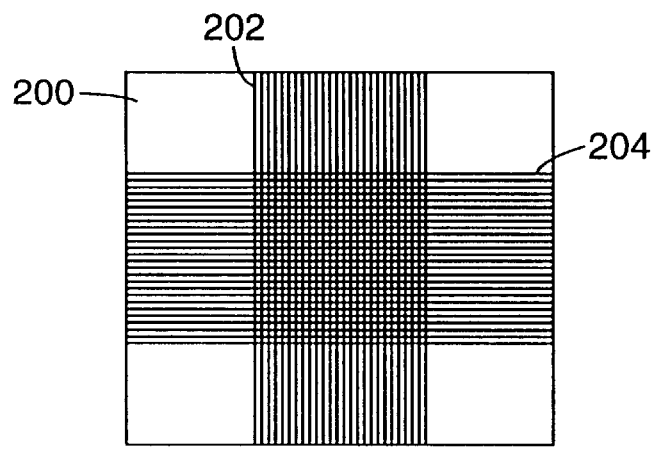
FIG. 5A is a layout of a diamond machined and electroformed metal tool which was used to mold an elastomeric matrix for the conducting structure of Example 1.
Figure 5B:
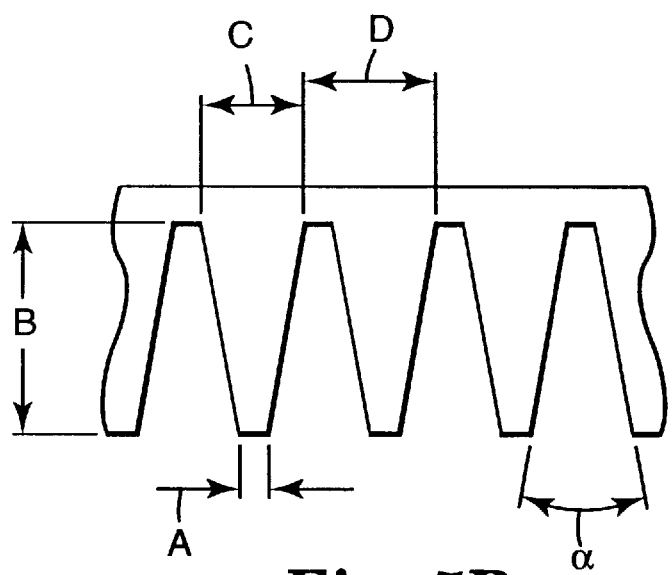
FIG. 5B is a profile of the projections of the tool illustrated in FIG. 5A.

A diamond machined substrate 200 was made according to the design shown in FIG. 5A. A first pattern 202 of 460 grooves was formed over a distance of 4.9818 inches (12.654 cm), and a second, identical groove pattern 204 was formed normal to the first pattern to create a cross-hatched design. The substrate was used to make an electroplated nickel casting tool with the projections shown in FIG. 5B (A=0.0071 cm, B=0.064 cm, C=0.0182 cm, D=0.0275 cm, $\alpha$=9°55').

A vinyl siloxane elastomeric impression material, available from Minnesota Mining and Manufacturing Co. (3M) under the tradename 3M #7302H was introduced onto the tool shown in FIG. 5B by squeegeeing with a polymeric blade. The vinyl siloxane was cured for approximately 10 minutes at room temperature and peeled from the tool to form a perforated, sheet-like matrix. As dictated by the dimensions of the tool described above, the matrix had a thickness of about 0.025 inches (0.064 cm), and included an array of vias on approximately 0.0108 inch (0.027 cm) pitch with a width at a first end of approximately 0.0072 inches (0.0183 cm) and at a second end of 0.0028 inches (0.0071 cm).

A slurry-like mixture consisting of a vinyl siloxane binder solution available from General Electric Co. Linder the tradename GE RTV #645, approximately 1 PPM platinum catalyst and 7 wt. %, based on the amount of binder, of hydride crosslinker, and 85% by weight, based on the total weight of particles and binder, of Novamet Lot #93-224 "Coarse Grade" silver coated nickel particles was spread over the surface of the matrix.

According to the manufacturer, the silver particles had diameters ranging from about 25 to about 75 microns. The average particle diameter was 53.9 microns as measured by the image analyzer available from Olympus under the tradename Cue-2. Thus, in this example the conductive particles had an average particle size of about 8% of the thickness of the matrix and 50% of the width of the via.

The particle size was measured using the following procedure: particles were placed on a glass slide in a single layer and isolated from one another. The glass slide was then placed under a microscope and once the desired image was obtained, the analyzer was used to determine the particle size distribution. The analyzer program was run on using the autoroute command, using a preset file. Thirty separate images for each sample were taken, and the histogram of the average ferets for the thirty images was taken as the particle size distribution. The average particle size data produced by the image analyzer were utilized.

Figure 6:
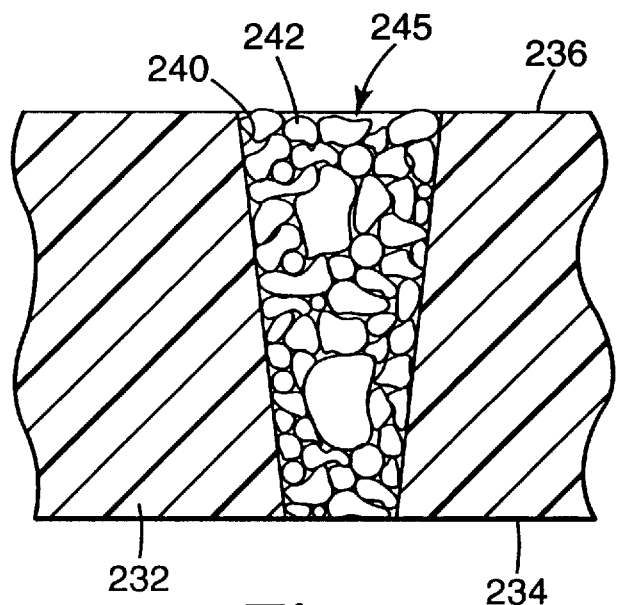
FIG. 6 is a schematic cross-sectional view of a conductive member of the present invention.

Films of polytetrafluroethylene (PTFE) available from duPont under the tradename Teflon were placed above and below the perforated matrix and a roller was used to cause the mixture to flow into the vias in the matrix. The PTFE films were removed and any remaining mixture was squeegeed from the surface the sheet with a glass plate. The binder was then cured for 2 minutes at 85° C. to form the finished connector. A schematic representation (not to scale) of a typical conductive member 245 in the via 240 with conductive elements 242 is shown in FIG. 6 (binder not shown).

Strips of the completed connector were cut to approximately 5.1 mm by 38 mm by 0.0635 mm and tested at room temperature in a Larson spring tester Model Super DHT by applying increasing pressures while recording the resulting displacements. The resulting modulus of the connector structure was 5.2 MPa at 0.3% strain and a stress of 0.75 MPa.

A 0.20 inch (0.051 cm) long by 1.5 inch (3.81 cm) wide connector, with the via rows angled at 30 degrees to the contact pads, was placed between two rigid printed circuit boards, with 50 gold plated contact pads on 0.032 inch (0.081 cm) pitch for electrical testing. Pressure was applied with a Larson Model Super DHT spring tester for room ambient tests and a spring loaded fixture for environmental tests.

Figure 7A:
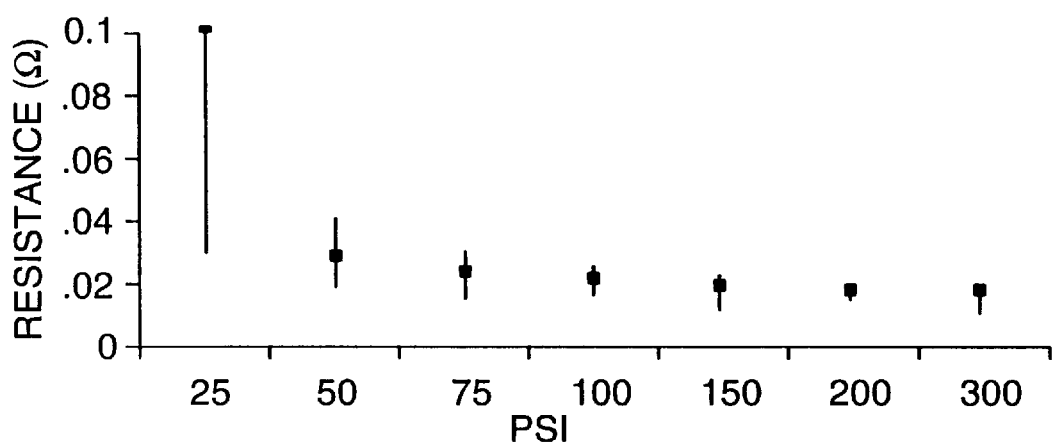
FIG. 7A is a plot of contact resistance vs. applied pressure for an embodiment of the connector of the invention as described in Example 1.
Figure 7B:
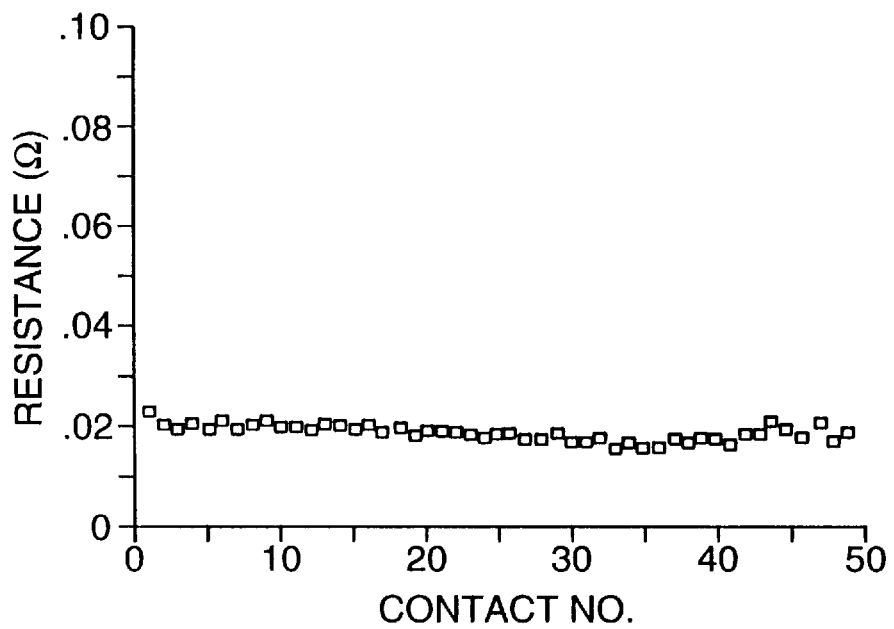
FIG. 7B is a plot of contact resistance for a 100 psi (0.69 MPa) applied pressure for an embodiment of the connector of the invention as described in Example 1.

The four-wire electrical resistance was measured on each of 50 electrical contact pairs at various applied pressures. The average and range of resistance over a range of contact pressures is shown in FIG. 7A, and data taken at 100 psi (0.69 MPa) are shown in FIG. 7B.

The sheet was placed between two polyimide printed circuit boards with and pressure engaged with stainless steel springs pressing on a stainless steel bar on the back of each board. The pressure was held constant at 100 psi (0.69 MPa) for 1800 hours, and the electrical resistance versus time was also measured with 85° C./85% relative humidity (RH) and −55° C. to +125° C. thermal cycling. The results of all environmental tests were: average resistance at 85° C./85% RH was approximately 30 mΩ with a range of about 15 mΩ; and, under −55° C. to +125° C. thermal cycling, average resistance was 45 mΩ with a range of 60 mΩ.

Example 2

A connector was made using the procedure described in Example 1. The nickel casting tool had a finer pitch pattern of truncated pyramids than in example 1, producing vias with a pitch of 0.0031 inches (0.0079 cm) a length of 0.004 inches (0.0102 cm) and a via width tapering from 0.0015 inches (0.0038 cm) to 0.0021 (0.0053 cm). The conductive elements, which were made of gold, had a diameter of about 10–20 microns. In this case the elements had an average size of about 60% of the width and about 15% of the length of the via. The matrix and binder materials and methods for fabrication and curing were the same as in example 1.

A 0.20 inch (0.51 cm) by 0.4 inch (1.02 cm) connector, with the via angle at 30 degrees to the contact pads, was placed between two rigid printed circuit boards with 50 gold plated contacts on 0.008 inch (0.0203 cm) pitch for electrical testing. The electrical resistance was measured over a range of applied pressures, using a four wire method, of each of the contacts. The average contact resistances for 50 contacts ranged from 0.080 ohms at 300 psi (2.1 MPa) to 0.123 ohms at 100 psi (0.69 MPa) applied pressure.

Example 3

A connector was made using the same nickel casting tool as in Example 1. The conductive members were made by squeegeeing in solder paste (ESP Solder Plus-SN63RA-A) with a razor blade to partially fill the holes from one side. Next, a slurry of GE RTV 645 Silicone and solid silver particles of 170 micron diameter at 85% by wt., based on the total weight of particles and binder, was squeegeed into the larger end of the vias with a razor blade. The sheet was then placed between two sheets of polyimide, on a 300° C. hot plate to melt the solder and cure the silicone in the slurry. The solid solder element filled the via from the small end to depth of about 0.015 inches (0.0381 cm) or about 60% of the length and 100% of the width of the via. The particle filled slurry filled the remaining length of the via. A schematic representation (not to scale) of a typical conductive member 345, including conductive elements 342 and solid solder element 350 in the via 340, in the matrix 332 is shown in FIG. 8 (binder not shown).

A 0.20 inch (0.51 cm) by 1 inch (2.54 cm) connector, with the vias angled at 30 degrees to the contact pads, was placed between two rigid printed circuit boards with 31 gold plated contacts on 0.032 inch (0.0081 cm) pitch for electrical testing. The electrical resistance was measured over a range of applied pressures, using a four wire method, of each of the contacts. The average contact resistances for 31 contacts ranged from 0.020 ohms at 300 psi (2.07 Mpa), 0.023 ohms at 200 psi (1.38 MPa), and 0.032 ohms at 100 psi (0.69 MPa) applied pressure.

Example 4

3M 7302H Polysiloxane resin was cast into and array of grooves in a nickel mold on 0.0108 inch (0.0274 cm) pitch with a groove geometry of 0.0072 inch (0.0183 cm) wide at the top tapering to 0.0028 inch (0.0071 cm) at the bottom and 0.025 inch (0.064 cm) deep. An additional thickness of 0.015 inch (0.0381 cm) of resin was cast on top of the channels to enclose them from one side. Following room temperature cure for approximately 10 minutes (600 sec), the ribbed material was removed from the nickel mold. The channels were then filled with a conductive slurry, by rolling and squeegeeing the material into the channels. The slurry consisted of GE RTV 645 polymethylsiloxane with 1 ppm platinum catalyst and 7% by weight, based on the total weight of binder, of a hydride cross linker mixed with Novamet "coarse grade" 15% silver coated nickel spheres (average diameter=54 μm) at 85% by weight, based on the total weight of binder and particles. The surface of the ribbed structure was scraped to remove any excess conductive material from the surface, which could create a conductive bridge between channels. The filled structure was then cured at 85° C. for 5 minutes (300 sec). After the structure had cooled, an additional layer of 3M 7302H resin was cast onto the side of the structure that the channels were filled from to provide a total thickness of approx. 0.06 inch (0.152 cm). The structure was cut across the channels to make 0.125 (0.318 cm) high connectors. These connectors had a single row of isolated, conductive vias 0.125 inch (0.3175 cm) long through their thickness.

The contact resistance of the connector was measured. The measurements were made by pressing the connector between two test boards, and using a 4-probe resistance measurement for each of the 50 traces on the test boards, for various contact forces. The traces were 0.016 inch (0.041 cm) wide, gold plated, and at 0.032 inch (0.0813 cm) pitch. The average contact resistance at an applied pressure of 0.25 MPa was 325±128 mΩ and at 0.5 MPa was 157±44 mΩ.

Example 5

A connector was made using the same procedure as in Example 4, but with a slurry which consisted of GE RTV 645 Polymethylsiloxane with 1 ppm platinum catalyst and 7% by wt hydride cross linker mixed with pure silver spheres having an average diameter of 170 μm at 85% wt., based on the total weight of binder and particles The average contact resistance at an applied pressure of 0.25 MPa was 103±35 mΩ and at 0.50 MPa was 74±21 mΩ. These data indicate lower resistances for the larger particles in this example as compared to Example 4.

Example 6

A connector was made and tested using the same procedure as in Example 4 but a combination of a flat wire and metal particles were used to make up the conductive slurry. The slurry consisted of GE RTV 645 polymethylsiloxane with 1 ppm platinum catalyst and 7% by wt hydride cross linker mixed with a mixture of 53.9 micron average diameter Novamet Lot #93-224 "Coarse Grade" 15 wt. % silver coated on nickel particles at about 85 wt. %, based on the total weight of binder and particles, and a single flat oxygen free copper wire, with a proprietary metal coating, from Hudson International, with Serial No. 58022 and cross sectional dimensions of 0.0015 inch (0.0038 cm) by 0.026 inch (0.0660 cm) in each groove. The flat wires were oriented to run the full length of each of the grooves. The electrical measurements were made in the same way as in Example 4. The average measured resistance was 25 mΩ at a pressure of 1.4 MPa.

Example 7

A vinyl siloxane binder solution available from General Electric Co. under the tradename GE RTV 645, 1 PPM platinum catalyst and approximately 7 wt. % hydride crosslinker was knife spread over a release surface to a thickness of approx. 0.025 inches (0.064 cm). The desired thickness was achieved by squeegeeing the liquid to a height controlled by spacers located around the sample. Solid silver particles of 13 micron and 100 micron diameter, respectively, were mixed into the liquid polymer at the maximum percentages by weight which still allowed good spreadability (see Table 1 below). The material was then cured for 2 minutes (120 sec) at 85° C.

A similar set of connector specimens were prepared with 3M 7302H polyvinyl siloxane liquid, which was formed and cured at room temperature for 10 minutes (600 sec).

The resulting sheets were cut into 0.185 inch (0.470 cm) by 0.185 inch (0.470 cm) by 0.025 inch (0.064 cm) specimens. The specimens were tested at room temperature in a Larson spring tester Model Super DHT by applying increasing pressures and recording the resulting displacements. The reported modulus values in Table 1 below are the slopes of the stress strain curves at the specified strains. The moduli were observed to increase with increasing strain, as is typical of crosslinked elastomers.

TABLE 1

|  | GE 645 @ 30% Strain (Particles @ 77% by wt.) | | | 3M 7302H @ 10% Strain (Particles @ 50% by wt.) | | |
| --- | --- | --- | --- | --- | --- | --- |
| Particle Dia. (microns) | None | 13 | 100 | None | 13 | 100 |
| Stress (Mpa) | 0.461 | 0.482 | 0.896 | 0.379 | 0.503 | 0.792 |
| Modulus (Mpa) | 2.69 | 2.72 | 9.4 | 5.68 | 4.97 | 18.8 |

Example 8

A first connector 9.7 cm$^2$ by 0.064 cm thick was prepared as described in Example 1.

A comparative connector of identical dimensions was prepared using a silicone sheet without conductive vias. The sheet was made of a silicone available from 3M under the trade designation 7302H.

A silver filled silicone sheet available from Chomerics Inc., Woburn, Mass., under the trade designation Cho-Seal #1220, having a known thermal conductivity, was used as a control sample. This 0.053 cm thick sheet appeared to be loaded with small particles, generally below 12 microns in diameter, and with a few particles up to 50 microns in diameter.

The connectors were placed between a heat source (a 1.905×1.905×5.08 cm aluminum block with an electric heating element available from the Vulcan Co., and a heat sink (a 15.24×7.62×30.5 cm aluminum block). The connectors were cut to cover one 1.905×5.08 cm face of the heater block. Thermocouples are inserted in the heater block and heat sink near the connector interface. A digital thermometer was used to measure the temperature of the heat source and the heat sink. The heating element was connected to a DC power source (63.1 V, 0.43 A, 27.1 W). The heater block was pressure engaged to the connector using a Carver Laboratory press at several applied pressures of 0.69, 1.38, and 2.07 Mpa, with the exception of the control, which was only tested at 1.38 Mpa. An insulating block was place between the heater block and the press, and fibrous insulation is used to insulate the entire system from the surroundings. The measured thermal conductivity was based solely on adiabatic conduction (i.e. all the power supplied is transferred to, and through, the connector) The thermal conductivity is based on the steady state temperature difference measured at the applied pressures.

Thermal Conductivity Equation:

$$k = \frac{Q \cdot t}{A \cdot \Delta T}$$

where
- k=thermal conductivity, mW/cm·° C.
- Q=power input, mW
- t=thickness, cm
- A=surface area, $cm^2$
- $\Delta T$=temperature difference, ° C.

The literature value for the thermal conductivity of the Cho-Seal #1220 silver filled silicone is 6.93 mW/cm° C., and the measured value was 6.28 mW/cm° C.

The measured values for the connector of Example 1 and the comparative 3M 7302H without vias are given in Table 2 below.

TABLE 2

| Pressure (Mpa) | Thermal Conductivity (mW/cm C.) | |
|---|---|---|
| | Sheet With Vias | Sheet Without Vias |
| 0.69 | 6.28 | 3.43 |
| 1.38 | 6.64 | 3.29 |
| 2.07 | 6.53 | 2.97 |

The use of thermally and electrically conductive vias was shown to increase the thermal conductivity by approximately a factor of two over the sheet without conductive vias.

The thermal conductivity of the Cho-Seal sheet and the connector of the present invention were similar, even though the particle loading by weight was considerably higher and throughout the sheet in the Cho-Seal material. The particle loading was estimated to be approximately 70% by weight for Cho-Seal and 50% by weight for the connector of this invention based on the total weight of the specimens. This indicates increased efficiency of thermal conduction with vias filled with large particles over systems which use small particles.

It will be understood that the exemplary embodiments described herein in no way limit the scope of the invention. Other modifications of the invention will be apparent to those skilled in the art in view of the foregoing description. These descriptions are intended to provide specific examples of embodiments which clearly disclose the present invention. Accordingly, the invention is not limited to the described embodiments or to the use of the specific elements, dimensions, materials or configurations contained therein. All alternative modifications and variations which fall within the spirit and scope of the appended claims are included in the present invention.

We claim:

1. A conducting structure, comprising:
   a dielectric matrix having a first surface and a second surface;
   a plurality of vias extending from the first surface of the matrix to the second surface of the matrix;
   a conductive member in at least one via, wherein at least one of the conductive members comprises two or more conductive elements, at least one of the conductive elements having a maximum dimension of: (i) at least about 5% of a length of the via, and, (ii) at least about 10% of the width of the via.

2. A conducting structure as claimed in claim 1, wherein the conductive member further comprises a polymeric binder.

3. A conducting structure as claimed in claim 2, wherein said conductive member has a modulus of about 1 MPa to about 200 MPa.

4. A conducting structure as claimed in claim 1, wherein the matrix is made of an elastomer selected from the group consisting of silicones, fluoroelastomers, fluorosilicone, urethane, acrylic, butyl, and latex.

5. A conducting structure as claimed in claim 2, wherein the binder is selected from the group consisting of silicones, urethane, acrylic, butyl, fluoroelastomers, fluorosilicone, and latex.

6. A conducting structure as claimed in claim 1, wherein the conductive elements in the conductive member are selected from the group consisting of copper, gold, silver, nickel, palladium, nickel, bismuth, tin, lead, metallized glass, metallized polymers, metallized ceramics, beryllia, boron nitride and alumina.

7. A conducting structure as claimed in claim 1, wherein the matrix is made of an adhesive material selected from the group consisting of hot tackifying, pressure sensitive, hot-melt and epoxy adhesives.

8. A conducting structure as claimed in claim 1, wherein the matrix is made of a material selected from the group consisting of ceramics and molded plastics.

9. An electronic assembly, comprising:
   (a) a connector comprising
      a sheet-like matrix having a first surface and a second surface, wherein the matrix is made of an elastomeric material;
      at least one via extending from the first surface of the matrix to the second surface of the matrix;
      a conductive member in at least one via in the matrix, wherein the conductive member comprises a binder and at least one conductive element, said conductive element having a maximum dimension of: (i) about 5% to about 120% of a length of the via, and, (ii) about 10% to about 100% of the width of the via, wherein said conductive member has a modulus of about 1 MPa to about 100 MPa following cure of the binder;
   (b) a first electronic device on the first surface of the matrix and a second electronic device on the second surface of the matrix, wherein the first device is electrically interconnected to the second device by at least one conductive member in the matrix.

10. An electronic assembly as claimed in claim 9, further comprising a clamping member which pressure engages the first electronic device and the second electronic device to bias at least one of the matrix and the conductive member and provide interconnection between the first electronic device and the second electronic device.

11. An electronic assembly as claimed in claim 9, wherein the binder comprises an elastomeric material selected from the group consisting of silicones, fluoroelastomers, fluorosilicone, urethane, acrylic, butyl, and latex.

12. An electronic assembly as claimed in claim 9, wherein the binder is a silicone.

13. An electronic assembly as claimed in claim 9, wherein the conductive elements in the conductive member are selected from the group consisting of gold, copper, silver, nickel, palladium nickel, bismuth, tin, lead, metallized glass, metallized polymers, metallized ceramics, beryllia, boron nitride and alumina.

14. A connector, comprising:
   a matrix having a first surface and a second surface, wherein the matrix is made of a silicone material;

a plurality of vias extending from the first surface of the matrix to the second surface of the matrix;

a conductive member in at least one via in the matrix, wherein the conductive member comprises conductive elements, a catalyst, and about 1% to about 50% by volume of a binder, wherein said conductive elements have a maximum dimension of: (i) about 10% to about 50% of a length of the via, and, (ii) about 50% of the width of the via, wherein said conductive member has a modulus of about 2 Mpa to about 30 MPa following cure of the binder.

15. A connector as claimed in claim 14, wherein the conductive elements in the conductive member are selected from the group consisting of gold, copper, silver, nickel, palladium nickel, bismuth, tin, lead, metallized glass, metallized polymers, metallized ceramics, beryllia, boron nitride and alumina.

16. A connector as claimed in claim 14, wherein the conductive elements have an average width of about $20\mu$ to about 2 mm and an average length of about $50\mu$ to about 5 mm.

17. A connector as claimed in claim 14, wherein at least one of the matrix and the binder comprise a polysiloxane.

18. A connector, comprising:

a matrix having a first surface and a second surface, wherein the matrix is made of a silicone material;

a plurality of vias extending from the first surface of the matrix to the second surface of the matrix;

a conductive member in at least one via in the matrix, wherein the conductive member comprises a solid portion and a resilient portion, said resilient portion comprising conductive elements, a catalyst, and about 1% to about 50% by volume of a curable binder, wherein said conductive elements have a maximum dimension of: (i) about 25% to about 50% of a length of the via, and, (ii) about 50% of the width of the via, and wherein said conductive member has a modulus of about 1 Mpa to about 30 MPa following cure of the binder.

19. A connector as claimed in claim 18, wherein the solid portion of the conductive member comprises a low melting temperature metal.

20. A connector as claimed in claim 18, wherein the conductive elements are silver particles with an average maximum dimension of at least 15 microns.

21. A connector as claimed in claim 18, wherein at least one of the matrix and the binder comprise a polysiloxane.

22. A method for interconnecting a first contact site on a first electronic device to a second contact site on a second electronic device, comprising the steps of:

(a) providing a connector comprising a matrix having a first surface and a second surface, wherein the matrix is made of an elastomeric material, vias extending from the first surface of the matrix to the second surface of the matrix; conductive members in the vias, wherein the conductive members comprise a binder and conductive elements, said conductive elements having a maximum dimension of: (i) about 5% to about 120% of a length of a via, and, (ii) about 10% to about 100% of the width of a via, and wherein said conductive member has a modulus of about 2 Mpa to about 100 MPa following cure of the binder;

(b) aligning the first contact site with at least one via on the first surface of the matrix of the connector;

(c) aligning the second contact site with at least one via on the second surface of the matrix of the connector, wherein the at least one via on the second surface of the matrix corresponds to the at least one via on the first surface of the matrix;

(d) applying pressure on the first electronic device and the second electronic device to bias the matrix of the connector and interconnect the first contact site and the second contact site.

23. A method as claimed in claim 22, wherein the pressure applied in step (d) to bias the connector is about 0.14 MPa to about 3.5 MPa.

24. A connector comprising:

(a) a matrix with a first surface in a first plane, a second surface in a second plane generally parallel to the first plane, and a third surface in a third plane generally normal to the first and second planes;

(b) at least one trough extending from the first surface to the second surface, wherein the trough has an opening accessible from the third surface;

(c) a conductive member in at least one trough in the matrix, wherein the conductive member comprises a binder and at least one conductive element, said conductive element having a maximum dimension of: (i) about 5% to about 120% of a length of the trough, and, (ii) about 10% to about 100% of the width of the trough, and wherein said conductive member has a modulus of about 2 Mpa to about 100 MPa;

(d) a first electronic device on the first surface of the matrix and a second electronic device on the third surface of the matrix, wherein the first device is interconnected with the second device by at least one conductive member in the matrix.

25. An connector as claimed in claim 24, further comprising a clamping member for pressure engaging the matrix in a first direction from the first surface to the second surface, and in a second direction substantially normal to the third surface.

26. A conductive assembly, comprising:

(a) a connector comprising a sheet-like matrix having a first surface and a second surface, wherein the matrix is made of an elastomeric material;

at least one via extending from the first surface of the matrix to the second surface of the matrix;

a conductive member in at least one via in the matrix, wherein the conductive member comprises a binder and at least one conductive element, said conductive element having a maximum dimension of: (i) about 5% to about 120% of a length of the via, and, (ii) about 10% to about 100% of the width of the via, and wherein said conductive member has a modulus of about 2 Mpa to about 100 MPa following cure of the binder;

(b) a thermal source on the first surface of the matrix and a thermal sink on the second surface of the matrix, wherein the source is thermally interconnected to the sink by at least one conductive member in the matrix.

27. A conductive assembly as claimed in claim 26, further comprising a clamping member which pressure engages the thermal source and the thermal sink to bias the matrix and provide interconnection between the source and the sink.

28. A conductive assembly as claimed in claim 26, wherein the binder is an elastomeric material selected from the group consisting of silicones, fluoroelastomers, fluorosilicone, urethane, acrylic, butyl, and latex.

29. A conductive assembly as claimed in claim 26, wherein the binder is a silicone.

30. A conductive assembly as claimed in claim 26, wherein the conductive elements in the conductive member are selected from the group consisting of gold, copper, silver, nickel, palladium nickel, bismuth, tin, lead, metallized glass, metallized polymers, metallized ceramics, alumina, beryllia and boron nitride.

31. A conductive assembly as claimed in claim 26, wherein the matrix is made of an adhesive material selected from the group consisting of hot tackifying, pressure sensitive, hot-melt and epoxy-matrixed adhesives.

* * * * *